US008801895B2

(12) United States Patent
Inomata

(10) Patent No.: US 8,801,895 B2
(45) Date of Patent: Aug. 12, 2014

(54) SEMICONDUCTOR MANUFACTURING EQUIPMENT AND MANUFACTURING METHOD OF THE SAME

(75) Inventor: Hirotaka Inomata, Aizuwakamatsu (JP)

(73) Assignee: Spansion, LLC, Sunnyvale, CA (US)

( * ) Notice: Subject to any disclaimer, the term of this patent is extended or adjusted under 35 U.S.C. 154(b) by 1765 days.

(21) Appl. No.: 12/026,425

(22) Filed: Feb. 5, 2008

(65) Prior Publication Data

US 2008/0210170 A1 Sep. 4, 2008

(30) Foreign Application Priority Data

Feb. 5, 2007 (JP) ................................. 2007-025334

(51) Int. Cl.

| | |
|---|---|
| ***H01L 21/00*** | (2006.01) |
| ***C23C 16/00*** | (2006.01) |
| ***C23F 1/08*** | (2006.01) |
| ***C23C 16/54*** | (2006.01) |
| ***C23C 16/44*** | (2006.01) |
| ***H01L 21/67*** | (2006.01) |

(52) U.S. Cl.

CPC ............. *C23C 16/54* (2013.01); *C23C 16/4404* (2013.01); *H01L 21/67126* (2013.01); *Y10S 156/916* (2013.01)

USPC ................. 156/345.31; 156/345.32; 156/916; 118/719; 118/733

(58) Field of Classification Search

USPC ........ 118/719, 733; 156/345.31, 345.32, 916; 414/939

See application file for complete search history.

(56) References Cited

U.S. PATENT DOCUMENTS

| | | | | |
|---|---|---|---|---|
| 5,223,113 | A * | 6/1993 | Kaneko et al. | 204/298.33 |
| 5,746,434 | A * | 5/1998 | Boyd et al. | 277/312 |
| 7,214,274 | B2 * | 5/2007 | Wallace et al. | 118/719 |
| 2004/0083970 | A1 * | 5/2004 | Imafuku et al. | 118/719 |

* cited by examiner

*Primary Examiner* — Karla Moore

(57) ABSTRACT

A semiconductor manufacturing equipment includes a first chamber that has a first connection hole, a second chamber that has a second connection hole connected to the first connection hole of the first chamber, an O-ring that is provided between the first chamber and the second chamber so as to surround the first connection hole and the second connection hole, and a cover portion that covers a space between the first chamber and the second chamber.

17 Claims, 5 Drawing Sheets

PRIOR ART

FIG. 5A
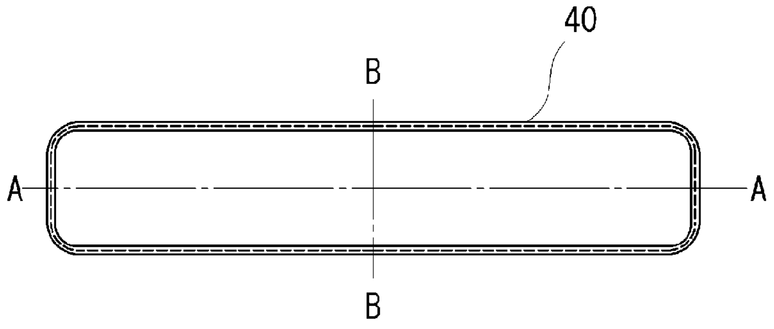
FIG. 5C
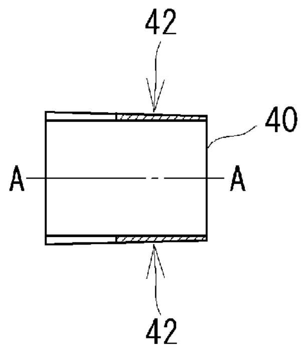
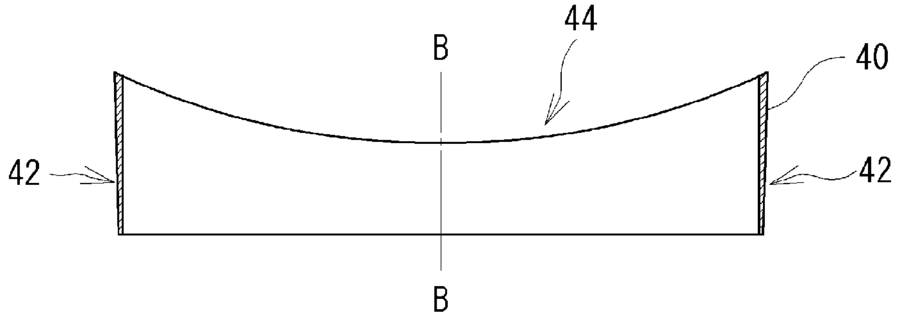
FIG. 5B

SEMICONDUCTOR MANUFACTURING EQUIPMENT AND MANUFACTURING METHOD OF THE SAME

TECHNICAL FIELD

This invention generally relates to a semiconductor manufacturing equipment and a manufacturing method of the semiconductor manufacturing equipment, and in particular, relates to a semiconductor manufacturing equipment to which one or more chambers are connected and a manufacturing method of the semiconductor manufacturing equipment.

BACKGROUND ART

A semiconductor manufacturing equipment such as an etching equipment, a CVD equipment or a sputtering equipment performs a process treatment such as an etching or deposition of a thin membrane in a chamber. There is a case where a plurality of chambers are connected to each other in the equipments. FIG. 1 illustrates a cross sectional view of a connection portion of two chambers disclosed in Japanese Patent Application Publication No. 5-211136. A first connection hole 12 of a first chamber 10 is connected to a second connection hole 22 of a second chamber 20. An O-ring 30 is provided between the first chamber 10 and the second chamber 20 in order to maintain vacuum in the two chambers. The O-ring 30 separates the two chambers from outside air.

However, gas or plasma in the first chamber 10 or in the second chamber 20 may cause a degradation of the O-ring, with the structure shown in FIG. 1. Therefore, the O-ring is often replaced. In particular, a quantity of the plasma reaching the O-ring is large because the plasma density is high, in a case where the first chamber 10 is a chamber for high-density plasma treatment. Therefore, the O-ring is easy to be degraded.

SUMMARY OF THE INVENTION

The present invention provides a semiconductor manufacturing equipment that restrains a degradation of the O-ring connecting two chambers and a manufacturing method of the semiconductor manufacturing equipment.

According to an aspect of the present invention, preferably, there is provided a semiconductor device a manufacturing method of a semiconductor device a semiconductor manufacturing equipment including a first chamber that has a first connection hole, a second chamber that has a second connection hole connected to the first connection hole of the first chamber, an O-ring that is provided between the first chamber and the second chamber so as to surround the first connection hole and the second connection hole, and a cover portion that covers a space between the first chamber and the second chamber. With the structure, it is possible to retrain a degradation of the O-ring connecting the two chambers, because the O-ring is not exposed to the gas or the plasma. It is therefore possible to reduce an exchange frequency of the O-ring.

According to another aspect of the present invention, preferably, there is provided a manufacturing method of a semiconductor manufacturing equipment including providing an O-ring between a first chamber having a first connection hole and a second chamber having a second hole so as to surround the first connection hole and the second connection hole, and providing a cover portion that covers a space between the first chamber and the second chamber. With the method, it is possible to retrain a degradation of the O-ring connecting the two chambers, because the O-ring is not exposed to the gas or the plasma. It is therefore possible to reduce an exchange frequency of the O-ring.

BRIEF DESCRIPTION OF THE DRAWINGS

FIG. 5A illustrates a front view of a cover portion;

FIG. 5B illustrates a cross sectional view taken along a line A-A in FIG. 5A; and FIG. 5C illustrates a cross sectional view taken along a line B-B in FIG. 5A.

DETAILED DESCRIPTION

A description will now be given of best modes for carrying out the present invention.

First Embodiment

Figure 2:
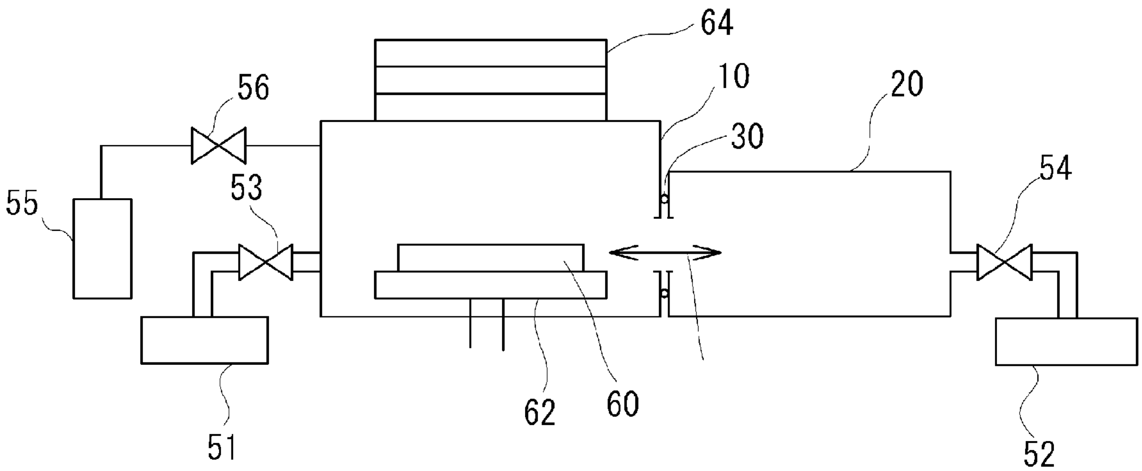
FIG. 2 illustrates a schematic view of a semiconductor manufacturing equipment in accordance with a first embodiment.

A first embodiment shows a CVD (Chemical Vapor Deposition) equipment of a high-density plasma type. FIG. 2 illustrates a schematic view of a semiconductor manufacturing equipment in accordance with the first embodiment. The first chamber 10 is a chamber for depositing a sediment on a surface of a wafer. An ICP (Inductive Coupled Plasma) source 64 is used as a high-density plasma source. A gas 55 for a process treatment is provided in the first chamber 10 through a valve 56. A vacuum pump 51 controls a pressure in the first chamber 10 through a valve 53 to be negative. There is provided a stage 62 in the first chamber 10. A wafer 60 is fixed to the stage 62. The second chamber 20 is a load lock chamber for carrying the wafer 60. A vacuum pump 52 controls a pressure in the second chamber 20 through a valve 54 to be negative. The first chamber 10 and the second chamber 20 have a connection hole where the wafer is carried.

In the above-mentioned structure, the vacuum pump 51 reduces the pressure in the first chamber 10, and the vacuum pump 52 reduces the pressure in the second chamber 20. The wafer 60 carried onto the stage 62 and is fixed to the stage 62. A gas for the process is provided into the first chamber 10. The ICP source 64 receives electrical power and generates high-density plasma. The gas reacts because of the plasma. The sediment is deposited on the wafer 60. A supply of the electrical power and the gas to the ICP source 64 is stopped after a desirable sediment is deposited on the wafer 60. The wafer 60 is carried to the second chamber 20 and carried outside of the semiconductor manufacturing equipment. Thus, the sediment is deposited on the wafer 60.

Figure 1:
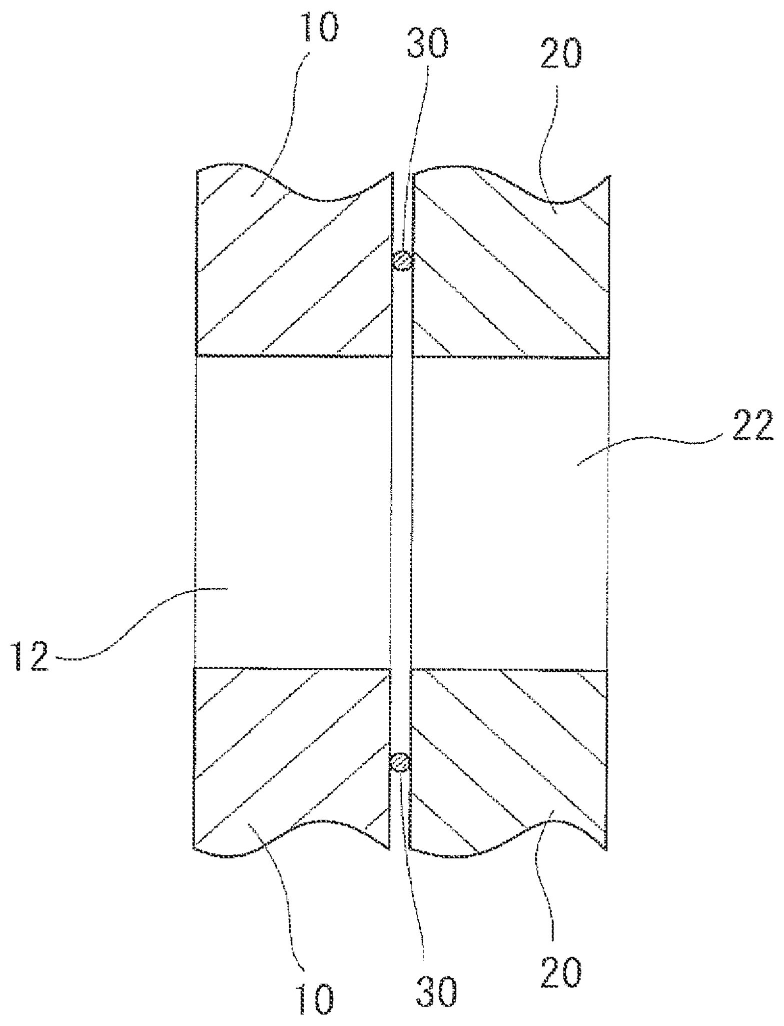
FIG. 1 illustrates a cross sectional view of a connection portion of a chamber in accordance with a conventional embodiment.
Figure 3:
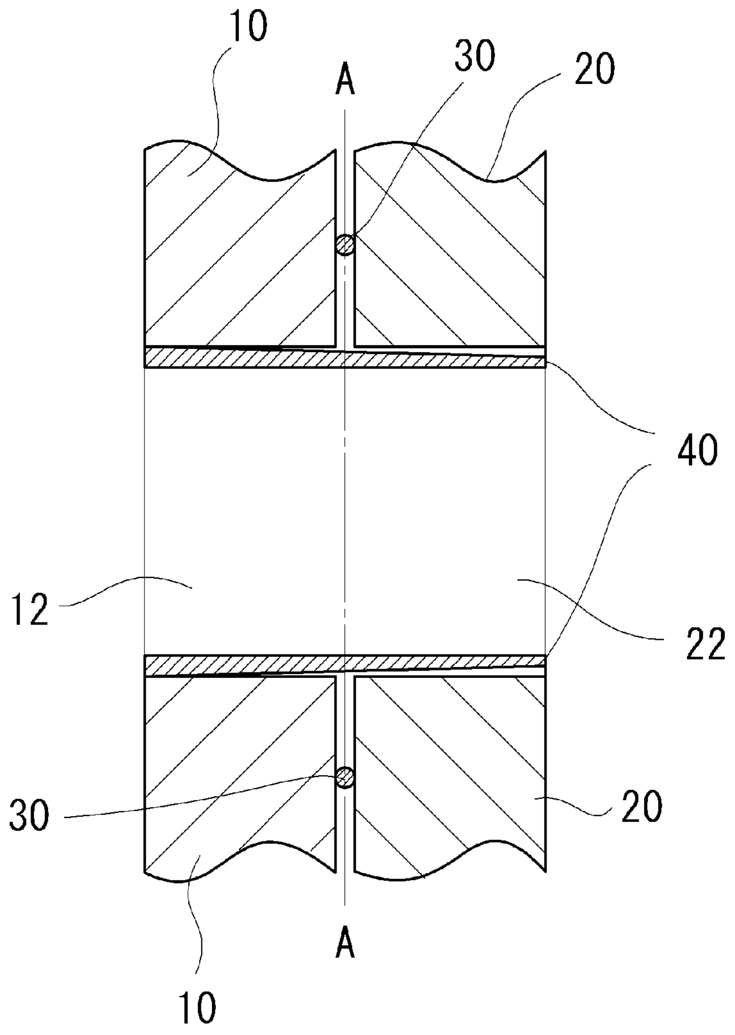
FIG. 3 illustrates a cross sectional view of a connection portion of a chamber of a semiconductor manufacturing equipment in accordance with the first embodiment.
Figure 4:
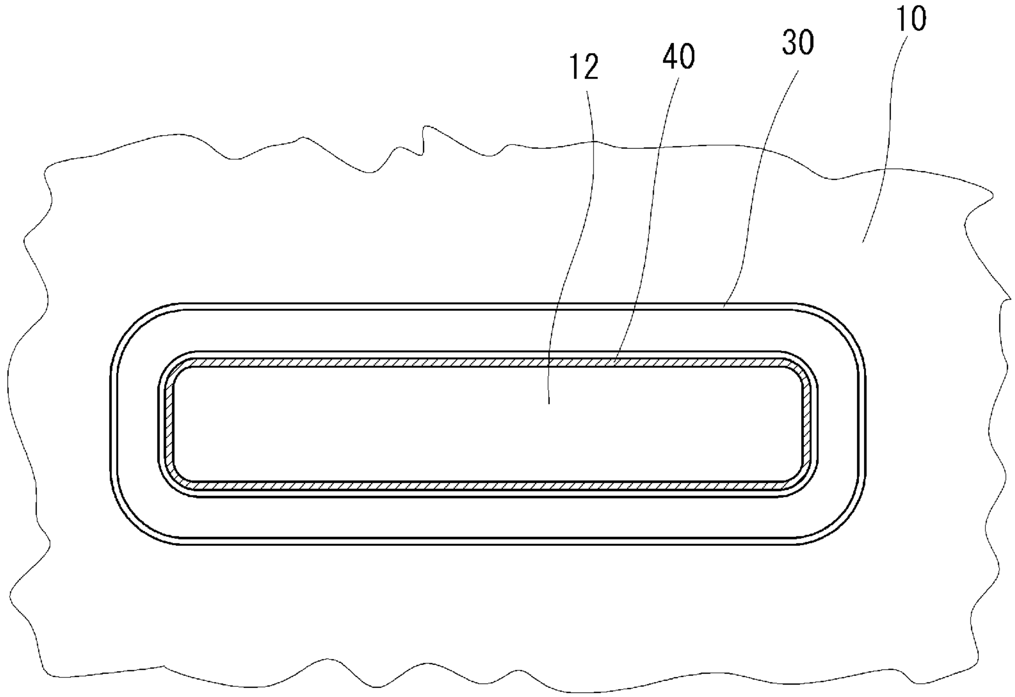
FIG. 4 illustrates a cross sectional view taken along a line A-A viewed from the side of the second chamber 20.

FIG. 3 illustrates an enlarged cross sectional view of a connection portion connecting the first chamber 10 and the second chamber 20. A cover portion 40 is inserted into the first connection hole 12 of the first chamber 10 and into the second connection hole 22 of the second chamber 20, in addition to the structure shown in FIG. 1. FIG. 4 illustrates a cross sectional view taken along a line A-A between the first chamber 10 and the second chamber 20 shown in FIG. 3 viewed from the side of the second chamber 20. The cover portion 40 is inserted into the first connection hole 12 in the first chamber 10. The O-ring 30 surrounds the first connection hole 12. That is, the O-ring 30 surrounds the first connection hole 12 and the second connection hole 22. The structure is obtained, when the O-ring 30 is provided so as to surround the first connection hole 12 and the second connection hole 22, and the cover portion 40 is provided so as to cover the space between the first chamber 10 and the second chamber 20. The O-ring 30 is made of silicon-based resin or the like (for example, a perfluoroelastomer resin). The first connection hole 12 and the second connection hole 22 have a horizontally long rectangular shape. The wafer 60 is carried in the first connection hole 12 and in the second connection hole 22.

FIG. 5A illustrates a front view of the cover portion 40. FIG. 5B illustrates a cross sectional view taken along a line A-A of FIG. 5A. FIG. 5C illustrates a cross sectional view taken along a line B-B of FIG. 5A. The cover portion 40 has a tube shape. A thickness of the cover portion 40 is higher on the side of the first chamber 10 and is lower on the side of the second chamber 20. In particular, the cover portion 40 has a taper shape in which the cover portion 40 is thinner on the side of the second connection hole 22 than on the side of the first connection hole 12. This results in that the cover portion 40 contacts to the first connection hole 12 and is spaced from the second connection hole 22.

As shown in FIG. 5B, an end portion 44 on the side of the first chamber 10 has a circular arc shape. This is because an inside of the first chamber 10 has a circular shape viewed from upper side. The cover portion 40 is, for example, made of aluminum. This is because the cover portion 40 is made of the same material as that of the first chamber 10 and the second chamber 20. The material of the cover portion 40 is not limited. However, the cover portion 40 is preferably made of the same material as that of the first chamber 10 and the second chamber 20. This is because a composition of the plasma is changeable when the cover portion 40 is exposed to the plasma, if the cover portion 40 is made of different material from that of the first chamber 10 and the second chamber 20.

The semiconductor manufacturing equipment in accordance with the first embodiment has the first chamber 10 having the first connection hole 12 and the second chamber 20 having the second connection hole 22. The O-ring 30 is provided between the first chamber 10 and the second chamber 20 so as to surround the first connection hole 12 and the second connection hole 22. The cover portion 40 covers the space between the first chamber 10 and the second chamber 20. It is therefore possible to restrain the degradation of the O-ring 30 because the O-ring 30 is not exposed to the gas or the plasma used in the first chamber 10. It is therefore possible to reduce the exchange frequency of the O-ring 30.

The cover portion 40 covers the space between the first chamber 10 and the second chamber 20. However, the cover portion 40 is preferably a tube provided in the first connection hole 12 and in the second connection hole 22. It is possible to cover the space between the first chamber 10 and the second chamber 20 when the tube acting as the cover portion 40 is inserted into the first connection hole 12 and into the second connection hole 22.

It is preferable that the cover portion 40 contacts to the first connection hole 12 and is spaced from the second connection hole 22 as shown in FIG. 3. It is restrained that the plasma generated in the first chamber 10 enters the space between the cover portion 40 and the first chamber 10. It is easy to adhere the cover portion 40 to the first connection hole 12 when the cover portion 40 is inserted from the side of the first connection hole 12, because the first connection hole 12 has approximately the same size as that of the second connection hole 22 and the cover portion 40 has the taper shape in which the thickness of the cover portion 40 is lower on the side of the second connection hole 22 than on the side of the first connection hole 12. This results in that the cover portion 40 is spaced from the second chamber 20.

It is preferable that the degree of vacuum in the first chamber 10 is lower than in the second chamber 20. This results in that the plasma in the first chamber 10 flows into the second chamber 20. Even if the second chamber 20 is spaced from the cover portion 40, the plasma does not reach the O-ring 30 through the space between the second chamber 20 and the cover portion 40 when the first chamber 10 closely contacts to the cover portion 40.

The plasma may cause the degradation of the O-ring 30 if the first chamber 10 is a chamber for the plasma treatment. In this case, the present invention has an advantage. The present invention has a particular advantage in a case where the first chamber 10 is a chamber for the high-density plasma treatment as shown in the first embodiment, because the O-ring 30 may be highly degraded because of the high-density plasma. The high-density plasma treatment may use ECR (Electron Cyclotron Resonance) plasma other than the ICP in accordance with the first embodiment.

The present invention has an advantage in a case where the first chamber 10 is a chamber for the CVD, because the gas used in the CVD may cause the degradation of the O-ring 30.

The present invention has an advantage in a case where the first connection hole 12 and the second connection hole 22 are a connection hole through which the wafer is carried between the first chamber 10 and the second chamber 20, because the size of the connection hole is large and the plasma may reach the O-ring 30 relatively easily. The present invention has an advantage in a case where the first chamber 10 is a chamber for the process treatment to the wafer 60 and the second chamber 20 is a chamber for the load lock chamber, because the plasma or the like in the first chamber 10 may reach the O-ring 30 through the large connection hole for carrying the wafer 60 relatively easily.

The gas used in the CVD equipment may be a silane-based gas, an ammonia gas, an inert gas or the like. The gas used in the etching equipment may be a fluorine-based gas, a chlorine-based gas, an inert gas or the like. However, the gas and the plasma used in the equipment are not limited if the gas and the plasma cause the degradation of the O-ring 30. The material of the O-ring 30 is not limited to that shown in the first embodiment. However, the present invention has a particular advantage in a resinous O-ring that is easy to be degraded because of the gas or the plasma.

Finally, various aspects of the present invention are briefly described below.

According to an aspect of the present invention, preferably, there is provided a semiconductor device a manufacturing method of a semiconductor device a semiconductor manufacturing equipment including a first chamber that has a first connection hole, a second chamber that has a second connection hole connected to the first connection hole of the first chamber, an O-ring that is provided between the first chamber and the second chamber so as to surround the first connection hole and the second connection hole, and a cover portion that covers a space between the first chamber and the second chamber. With the structure, it is possible to retrain a degradation of the O-ring connecting the two chambers, because the O-ring is not exposed to the gas or the plasma. It is therefore possible to reduce an exchange frequency of the O-ring.

The cover portion may be a tube that is provided in the first connection hole and in the second connection hole. With the structure, it is possible to cover a space between the first chamber and the second chamber, when the tube acting as the cover portion is inserted into the first connection hole and the second connection hole.

The cover portion may contact to an inner face of the first connection hole and is spaced from an inner face of the second connection hole. With the structure, it is restrained that the gas and the plasma from the first chamber reaches the O-ring.

The cover portion may have a taper shape in which a diameter of the cover portion is more reduced in the second connection hole than in the first connection hole. With the structure, it is easy to adhere the cover portion to the first connection hole when the cover portion is inserted from the side of the first connection hole.

The first chamber and the second chamber may have a negative pressure. And a degree of vacuum in the first chamber may be lower than that in the second chamber.

The first chamber may be a chamber for a plasma treatment. With the structure, it is possible to restrain the degradation of the O-ring caused by the plasma.

The first chamber may be a chamber for a high-density plasma treatment. With the structure, it is possible to restrain the degradation of the O-ring caused by the high-density plasma.

The first chamber may be a chamber for CVD.

The first connection hole and the second connection hole may be a connection hole where a wafer is carried between the first chamber and the second chamber. With the structure, the size of the connection hole is large. And the plasma and the gas may reach the O-ring relatively easily. Therefore, the present invention has an advantage in restraining of the degradation of the O-ring.

The first chamber may be a chamber for a process treatment to the wafer. And the second chamber may be a load lock chamber. With the structure, the size of the connection hole is large. And the plasma and the gas may reach the O-ring relatively easily. Therefore, the present invention has an advantage in restraining of the degradation of the O-ring.

According to another aspect of the present invention, preferably, there is provided a manufacturing method of a semiconductor manufacturing equipment including providing an O-ring between a first chamber having a first connection hole and a second chamber having a second hole so as to surround the first connection hole and the second connection hole, and providing a cover portion that covers a space between the first chamber and the second chamber. With the method, it is possible to retrain a degradation of the O-ring connecting the two chambers, because the O-ring is not exposed to the gas or the plasma. It is therefore possible to reduce an exchange frequency of the O-ring.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2007-025334 filed on Feb. 5, 2007, the entire disclosure of which is hereby incorporated by reference.

I claim:

1. A semiconductor manufacturing equipment comprising:

a first chamber comprising a first connection hole formed through a first wall;

a second chamber comprising a second connection hole formed through a second wall, wherein the first and second connection holes are coupled by a cover portion wherein a thickness of the cover portion is greater on the side of the first chamber than on the side of the second chamber; and an O-ring that is provided between the first chamber and the second chamber so as to surround the first connection hole and the second connection hole, wherein the cover portion is configured to contact the first wall in the first connection hole and is spaced apart from the second wall in the second connection hole, to cover a space between the first chamber and the second chamber and shield the O-ring.

2. The semiconductor manufacturing equipment as claimed in claim 1, wherein the cover portion is a tube that is provided in the first connection hole and in the second connection hole.

3. The semiconductor manufacturing equipment as claimed in claim 1, wherein the cover portion has a taper shape in which a diameter of the cover portion is more reduced in the second connection hole than in the first connection hole.

4. The semiconductor manufacturing equipment as claimed in claim 1, wherein:

the first chamber and the second chamber have a negative pressure; and a degree of vacuum in the first chamber is lower than that in the second chamber.

5. The semiconductor manufacturing equipment as claimed in claim 1, wherein the first chamber is a chamber for a plasma treatment.

6. The semiconductor manufacturing equipment as claimed in claim 5, wherein the first chamber is a chamber for a high-density plasma treatment.

7. The semiconductor manufacturing equipment as claimed in claim 5, wherein the first chamber is a chamber for CVD.

8. The semiconductor manufacturing equipment as claimed in claim 1, wherein the first connection hole and the second connection hole are a connection hole where a wafer is carried between the first chamber and the second chamber.

9. The semiconductor manufacturing equipment as claimed in claim 8, wherein:

the first chamber is a chamber for a process treatment to the wafer; and the second chamber is a load lock chamber.

10. A semiconductor manufacturing method comprising:

providing an O-ring between a first chamber comprising a first connection hole formed through a first wall of said first chamber and a second chamber comprising a second hole formed through a second wall of said second chamber, whereby the O-ring is configured to surround the first connection hole and the second connection hole; and providing a cover portion to connect the first connection hole and the second connection hole and cover a space between the first chamber and the second chamber whereby the cover portion is configured to contact the first wall in the first connection hole and is spaced apart from the second wall in the second connection hole, to shield the O-ring wherein a thickness of the cover portion is greater on the side of the first chamber than on the side of the second chamber.

11. The semiconductor manufacturing method of claim 10, wherein the cover portion comprises a tube inserted into the first connection hole and into the second connection hole.

12. The semiconductor manufacturing method of claim 11, comprising tapering the cover portion whereby diameter of the cover portion is more reduced in the second connection hole than in the first connection hole.

13. The semiconductor manufacturing method of claim 10, comprising forming a negative pressure in the first chamber and the second chamber, whereby and a degree of vacuum in the first chamber is lower than that in the second chamber.

14. The semiconductor manufacturing method of claim 10, comprising conducting plasma treatment in the first chamber.

15. The semiconductor manufacturing method of claim 10, comprising conducting high-density plasma treatment in the first chamber.

16. The semiconductor manufacturing method of claim 10, comprising conducting chemical vapor deposition (CVD) in the first chamber.

17. The semiconductor manufacturing method of claim 10, comprising transporting a semiconductor wafer between the first chamber and the second chamber.

* * * * *